United States Patent [19]

Fujiki

[11] 4,314,269
[45] Feb. 2, 1982

[54] SEMICONDUCTOR RESISTOR COMPRISING A RESISTOR LAYER ALONG A SIDE SURFACE

[75] Inventor: Kunimitsu Fujiki, Kawasaki, Japan

[73] Assignee: VLSI Technology Research Association, Kawasaki, Japan

[21] Appl. No.: 45,890

[22] Filed: Jun. 6, 1979

[30] Foreign Application Priority Data

Jun. 6, 1978 [JP] Japan .................................. 53-68575

[51] Int. Cl.³ ............................................ H01L 27/04
[52] U.S. Cl. ......................................... 357/51; 357/4; 357/20; 357/49; 357/55
[58] Field of Search ...................... 357/51, 55, 20, 49, 357/4

[56] References Cited

U.S. PATENT DOCUMENTS

| 4,017,885 | 4/1977 | Kendall et al. | 357/51 |
| 4,065,742 | 12/1977 | Kendall et al. | 357/51 |
| 4,118,728 | 10/1978 | Berry | 357/51 |

Primary Examiner—William D. Larkins
Attorney, Agent, or Firm—Sughrue, Mion, Zinn, Macpeak and Seas

[57] ABSTRACT

A semiconductor resistor comprises a semiconductor resistor layer along at least an area of an internal side surface of a groove formed in a predetermined configuration, such as a figure of $\pi$, in a semiconductor block of a conductivity type opposite to that of the resistor layer. Semiconductor contact layers are formed preferably simultaneously with the resistor layer in electrical contact therewith on a principal surface of the block, with which surface the internal side surface may or may not form the right angle. The block may or may not be supported by a substrate, such as a sapphire, a spinel, or a like insulator single crystal. The groove may have a bottom in the block or the substrate. When the bottom is either in the block or on a semiconductor bulk serving as the substrate, a P-N junction should be formed along the extension of the bottom. A highly doped region may be previously formed near the bottom when the resistor layer is formed by diffusing an impurity onto the internal side surface and to the bottom.

10 Claims, 9 Drawing Figures

SEMICONDUCTOR RESISTOR COMPRISING A RESISTOR LAYER ALONG A SIDE SURFACE

BACKGROUND OF THE INVENTION

This invention relates to a semiconductor resistor, which is particularly suitable for use in a semiconductor integrated circuit.

A semiconductor integrated circuit comprises a semiconductor substrate of a predetermined conductivity type. In such an integrated circuit, it is usual to provide a resistor by doping the substrate with an impurity in a predetermined configuration to form a semiconductor resistor region of the conductivity type opposite to that of the substrate. The resistance of the semiconductor resistor is determined by the impurity concentration and the predetermined configuration. As will later be described with reference to a few figures of the accompanying drawing, an intricate calculation has been necessary to attain a highly precise resistance. In other words, it has been difficult to provide a semiconductor resistor having a precise resistance. Furthermore, a conventional semiconductor resistor occupies a wide area in the integrated circuit.

SUMMARY OF THE INVENTION

It is therefore an object of the present invention to provide a semiconductor resistor having a sufficiently precise resistance.

It is another object of this invention to provide a semiconductor resistor of the type described, which is readily designed without intricate calculation.

It is still another object of this invention to provide a semiconductor resistor of the type described, which occupies a smaller area in an integrated circuit than a conventional semiconductor resistor.

According to this invention, there is provided a semiconductor resistor comprising a semiconductor block having a predetermined conductivity type, an internal side surface defining a groove extended in said semiconductor block in a predetermined configuration with a first and a second area predetermined on the side surface, and a principal surface contiguous to the side surface including the first and the second areas, the side surface comprising an intermediate area between and contiguous to the first and the second areas, a semiconductor layer of the conductivity type opposite to said predetermined conductivity type, the semiconductor layer covering the first, the second, and the intermediate areas, and a first and a second contact layer of the opposite conductivity type along those predetermined areas of the principal surface which are contiguous to the first and the second areas, respectively, the first and the second contact layers being electrically connected to those portions of the semiconductor layer which cover the first and the second areas, respectively.

DESCRIPTION OF THE PREFERRED EMBODIMENTS

Figure 1:
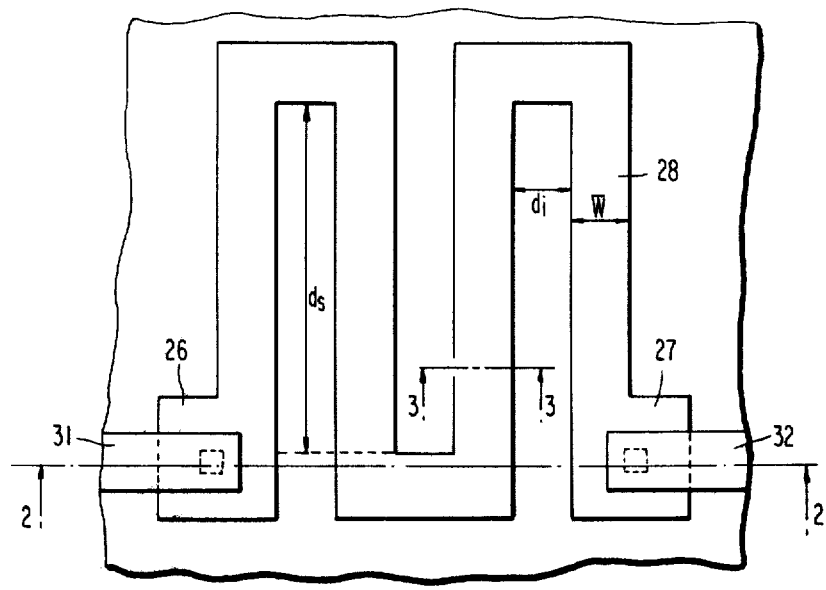
FIG. 1 shows a top view of a conventional semiconductor resistor with an oxide film removed.
Figure 2:
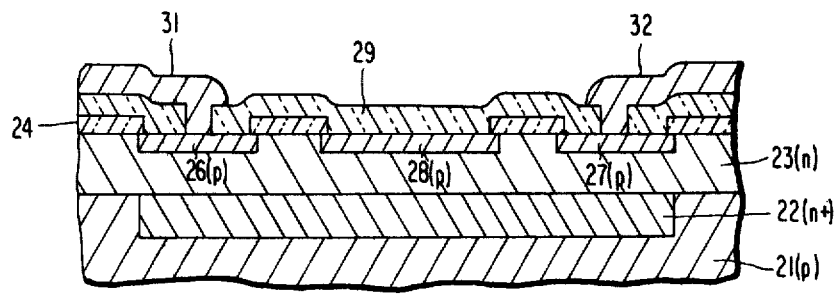
FIG. 2 shows a sectional view taken along a line 2—2 in FIG. 1.

Referring to FIGS. 1 and 2, a conventional semiconductor resistor will be described for a better understanding of this invention. As shown in FIG. 2, the semiconductor resistor comprises a substrate 21 of a P-type silicon single crystal, a buried layer 22 of N+ conductivity type in the substrate 21, and an epitaxial layer 23 of N conductivity type on the substrate 21. With an oxide film 24 formed on the epitaxial layer 23 and selectively removed therefrom, an impurity of P conductivity type is diffused into the epitaxial layer 23 to form a first and a second contact layer 26 and 27 and a resistor layer 28. As depicted also in FIG. 1, the resistor layer 28 extends between the contact layers 26 and 27 and is continuous thereto. A field oxide film 29 (FIG. 2) is formed on the whole surface with a contact hole formed to expose a small area on each of the contact layers 26 and 27. Conductive layers 31 and 32 of aluminum are attached to the first and the second contact layers 26 and 27 through the contact holes, respectively. The buried layer 22 serves to prevent a parasitic PNP transistor from being formed among the resistor layer 28, the epitaxial layer 23, and the substrate 21.

In the example illustrated with reference to FIGS. 1 and 2, the resistor layer 28 has a substantially constant width W (FIG. 1) along a principal surface of the epitaxial layer 23 and is formed in a meandering configuration with a pair of long linear portions extended in the same direction and sense from the first and the second contact layers 26 and 27 and connected by similar long linear portions and equal short linear portions. The resistor layer 28 occupies an area A outlined by outer sides of the above-mentioned long linear portion pair and the short linear portions. The area A is given by:

$$A = [nW + (n-1)d_i][d_s + 2W],$$

where: $d_s$ represents the length of each long linear portion between the short linear portions; $d_i$, the distance between two adjacent sides of the long linear portions; and n, the number of the long linear portions. The resistor layer 28 has a resistance R given by:

$$R = R_s L/W,$$

where $R_s$ represents the sheet resistance and L, the length between the contact layers 26 and 27. As will readily be understood, both the length L and the width W are ambiguous in the illustrated example because of small squares at which the long and the short linear portions are connected.

Figure 3:
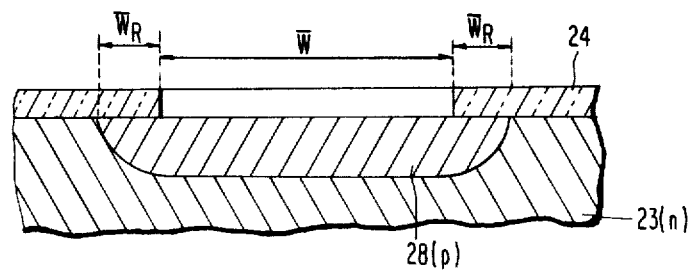
FIG. 3 shows a partially enlarged sectional view taken along another line 3—3 in FIG. 1.

Referring to FIG. 3, the resistor layer 28 extends partially under the oxide film 24 to a certain extent because the impurity is inevitably diffused also along the epitaxial layer principal surface. The extent is represented by an additional width $W_R$. It is now understood that the additional width $W_R$ and the vertical sectional outline of the sidewards diffused portions have to be taken into consideration on determining the precise value of the resistance R. A tolerance of ±10% is therefore usual for conventional semiconductor resistors.

Figure 4:
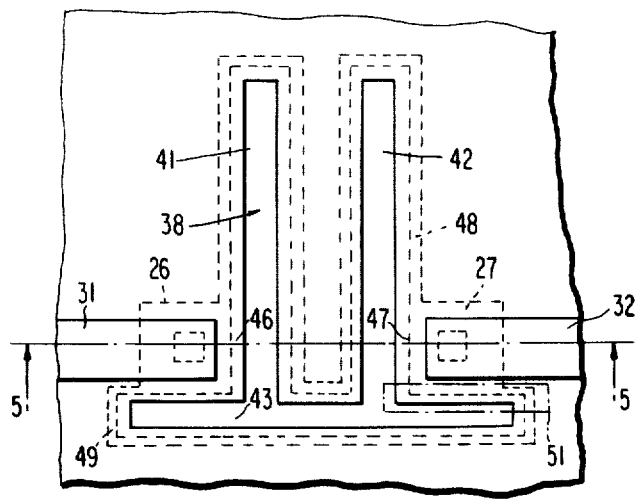
FIG. 4 is a schematic top view of a semiconductor resistor according to a first embodiment of this invention.
Figure 5:
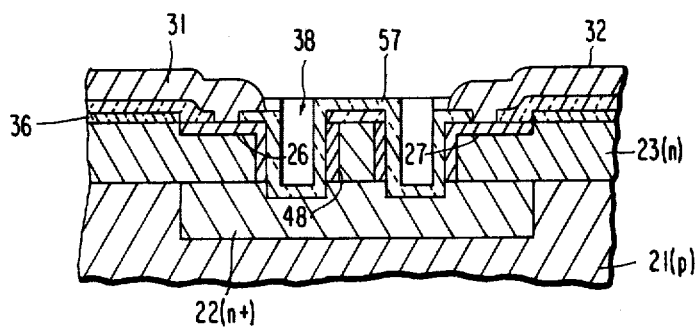
FIG. 5 is a diagrammatical sectional view taken on a plane indicated by a line 5—5 in FIG. 4.

Turning to FIGS. 4 and 5, a semiconductor resistor according to a first embodiment of this invention comprises a substrate 21 of a p-type silicon single crystal, a buried layer or region 22 of $n^+$ conductivity type in the substrate 21 contiguous to a principal surface thereof, and an epitaxial layer 23 of n conductivity type on the principal surface. By way of example, the p-type substrate region has an impurity concentration of about $10^{15}$ cm$^{-3}$. The buried layer 22 has an impurity concentration of about $10^{19}$ cm$^{-3}$ and a depth of about 2 microns. The epitaxial layer 23 has an impurity concentration of about $10^{16}$ cm$^{-3}$ and a thickness of about 2 microns. The epitaxial layer 23 is selectively covered with a first oxide layer 36 and photoetched to form a groove 38 reaching the substrate principal surface. As the case may be, the groove 38 is extended into the buried layer 22 to a depth of a fraction of micron as shown in FIG. 4. When necessary, the epitaxial layer 23 with the groove 38 is referred to as a semiconductor block (designated by 23). The substrate 21 having the buried layer 22 is called a substrate member and has a substrate member principal surface. It is now understood that the semiconductor block has a predetermined conductivity type, an internal side surface defining the groove 38, and a semiconductor block principal surface contiguous to the side surface. The substrate member serves as a support for the semiconductor block with a back surface of the semiconductor block, opposite to the semiconductor block principal surface, brought into contact with the substrate principal surface.

In the example depicted in FIGS. 4 and 5, the groove 38 has a substantially figure-of-$\pi$ configuration with the internal side surface rendered substantially perpendicular to the semiconductor block principal surface. The figure of $\pi$ has a pair of legs 41 and 42 and a line 43 that extends on the legs 41 and 42. First and second areas 46 and 47 are predetermined on those inwardly directed portions of the side surface which are along the respective legs 41 and 42 adjacently of the line 43.

In FIGS. 4 and 5, the first oxide film 36 is partially removed by photoetching to expose those predetermined areas of the semiconductor block principal surface which are contiguous to the first and the second areas 46 and 47. A p-type impurity is diffused into the semiconductor block 23 and to that $\pi$-shaped region of the buried layer 22 which serves as a bottom of the groove 38. A resistor layer 48 of the p conductivity type is formed along the first and the second areas 46 and 47 and that intermediate area of the internal side surface which extends between the first and the second areas 46 and 47 along the legs 41 and 42 of the $\pi$ figure. An additional resistor layer 49 is formed along an additional intermediate area extending between the first and the second areas 46 and 47 mainly along that portion of the side surface which is along the line 43 of the $\pi$ figure and directed towards the legs 41 and 42. First and second contact layers 26 and 27 are formed along the respective predetermined areas in electrical contact with the resistor layer 48. The resistor layer 48 is brought into contact with the buried layer at the bottom of the groove 38 to form a PN junction therebetween. The buried layer 22 has an impurity concentration high enough to keep the n conductivity type even at the $\pi$-shaped region. Consequently, the p-impurity doped region in the buried layer 22 is not depicted in FIG. 5. The additional resistor layer 49 is removed by photoetching at portion 51 contiguous to the second area 47. A second oxide layer 57 is formed on the remaining portion of the first oxide layer 36, the bottom of the groove 38, the resistor layer 48, the remaining portion of the additional resistor layer 49, and the resistor layer-removed portion 51. The second oxide layer 57 thus covers the whole exposed surface with contact holes (FIG. 5) formed to expose small areas on the respective contact layers 26 and 27. Conductive layers 31 and 32 of aluminium are formed partially on the second oxide layer 57 and brought into electrical contact with the respective contact layers 26 and 27. The depth of the p-impurity diffusion may be about 0.5 micron. The impurity concentration may be about $10^{17}$ cm$^{-3}$. The thickness of the second oxide layer 57 may be about 0.5 micron.

In a modification of the resistor illustrated with reference to FIGS. 4 and 5, the above-mentioned portions of the additional resistor layer 49 are not removed. The contact layers 26 and 27 are connected by parallel resistor layers 48 and 49. This is convenient in providing a low-resistance semiconductor resistor.

Figure 6:
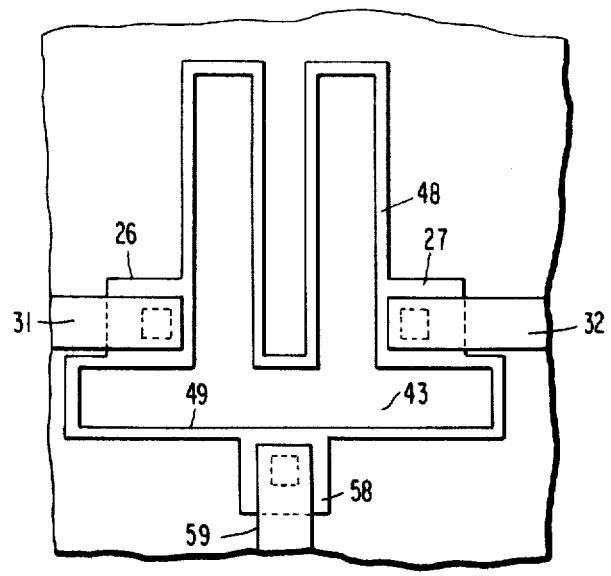
FIG. 6 shows a plan view of a semiconductor resistor according to a second embodiment of this invention with an oxide film removed.
Figure 7:
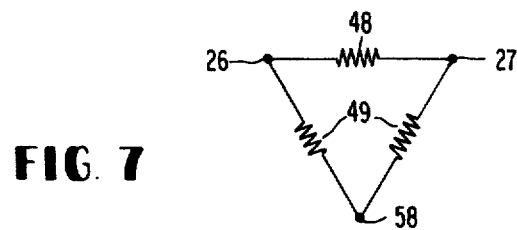
FIG. 7 is an equivalent circuit of the semiconductor resistor illustrated in FIG. 6.

Referring now to FIGS. 6 and 7, a semiconductor resistor according to a second embodiment of this invention comprises similar parts designated by like reference numerals as in FIGS. 4 and 5. As in the modification described in conjunction with FIGS. 4 and 5, the additional resistor layer 49 is used as an element of the resistor. Furthermore, a third contact layer 58 is formed during the p-type impurity diffusion at a center portion of the line 43 of the $\pi$ figure in electrical contact with the additional resistor layer 49. The second oxide layer 57 has an additional contact hole (not shown) to expose a small area of the third contact layer 58. A third conductive layer 59 of aluminium is attached to the third contact layer 58 through the additional contact hole.

Figure 8:
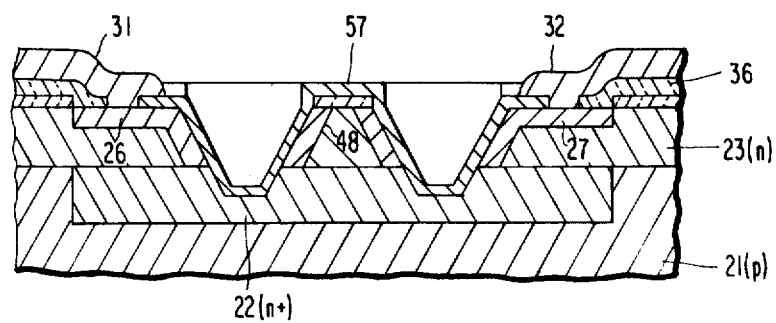
FIG. 8 is a sectional view of a semiconductor resistor according to a third embodiment of this invention.

Referring to FIG. 8, a semiconductor resistor according to a third embodiment of this invention again comprises similar parts designated by like reference numerals as in FIGS. 4 and 5. The illustrated resistor may comprise the third contact area and the third conductive layer described in connection with FIG. 6. The internal side surface forms an angle other than the right angle with the semiconductor block principal surface.

Figure 9:
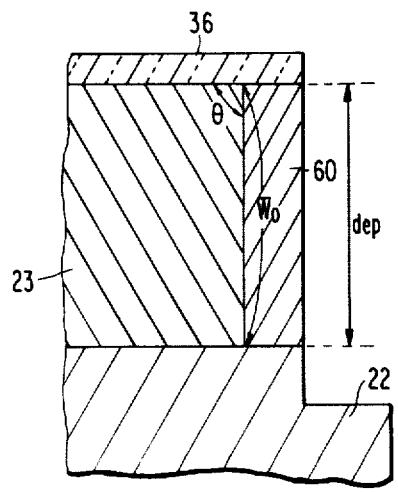
FIG. 9 is a partially enlarged sectional view of a semiconductor resistor according to this invention.

Referring to FIG. 9, let a resistor layer 60 represent any one of the resistor layers 48 and 49 described in conjunction with FIGS. 4 through 6 and 8. A width $W_O$ of the resistor layer 60 is clearly defined along the internal side surface of the semiconductor block 23 between the buried layer 22 and the first oxide layer 36 and is given by:

$$W_O = d_{ep}/\sin \theta,$$

where $d_{ep}$ represents the thickness of the epitaxial layer 23 and $\theta$, an angle formed between the internal side surface and the semiconductor block principal surface.

Referring back to FIGS. 4 and 6, it will be obvious that the predetermined configuration may comprise additional legs that are similar to the legs 41 and 42. In any event, the length of the resistor layer 48 or 49 is far less ambiguous than that described in connection with FIG. 1. The width $W_O$ (FIG. 9) plays substantially no part in the area occupied by the resistor layer 48 in the semiconductor substrate 21 in marked contrast to the width W (FIG. 1). In practice, the width of the groove 38 at the legs, such as 41 and 42, is as narrow as 1 micron.

While this invention has thus far been described in conjunction with a few embodiments thereof, it would now be readily possible for those skilled in the art to carry this invention into effect in various other manners. For example, the conductivity types of the semiconductor block 23 and the resistor layer, such as 48, may be reversed together with the substrate 21, the buried layer 22, and the contact layers, such as 26 and 27. The buried layer 22 may be dispensed with to render the impurity of the substrate member substantially constant at least along the substrate member principal surface either when the substrate 21 is given a high concentration of impurity of the conductivity type of the semiconductor block 23 or when the substrate 21 is given the last-mentioned conductivity type with application of ion etching or similar processes to remove that region of the substrate 21 in which the impurity is doped on forming the resistor layer, such as 48. It is now understood that the groove 38 having a bottom may be directly formed in the substrate 21 without the use of the epitaxial layer 23. Alternatively, it is possible to use the semiconductor block 23 without the substrate member and with the groove 38 thus extending between the semiconductor block principal surface and the back surface. Finally, the substrate member may be a single crystal of an insulating material, such as sapphire or a magnesium-aluminate or like spinel having a substrate member principal surface of an appropriate set of indices with the epitaxial layer 23 grown thereon. In contrast to the insulator substrate, the semiconductor substrate member may be named a semiconductor bulk having a substrate member principal surface.

What is claimed is:

1. A semiconductor resistor comprising:
   a semiconductor block having a predetermined conductivity type, a block principal surface, a back surface opposite to said principal surface, and meandering internal side surface contiguous to said principal and said back surfaces, said internal side surface defining a groove extending in said semiconductor block and comprising first and second predetermined areas on said internal side surface and an intermediate area between and continuous to said first and said second areas;
   a semiconductor bulk of the predetermined conductivity type having a bulk principal surface in contact with said back surface, with a portion of the bulk principal surface exposed through said groove to define a bottom of said groove, said semiconductor bulk having a substantially uniform impurity concentration at least along said bulk principal surface;
   a semiconductor layer of the conductivity type opposite to said predetermined conductivity type, said semiconductor layer covering said first, said second, and said intermediate areas; and
   a first and a second contact layer of the opposite conductivity type along those predetermined areas of said block principal surface which are contiguous to said first and second areas, respectively, said first and said second contact layers being electrically connected to those portions of said semiconductor layer which cover said first and said second areas, respectively.

2. A semiconductor resistor as claimed in claim 1, further comprising an insulator layer on said semiconductor layer and the bottom of said groove with said first and said second contact layers uncovered with said insulator layer.

3. A semiconductor resistor as claimed in claims 1 or 2, wherein said side surface is substantially perpendicular to the semiconductor block principal surface.

4. A semiconductor resistor as claimed in claims 1 or 2, wherein said side surface forms an angle other than a right angle with the semiconductor block principal surface.

5. A semiconductor resistor comprising:
   a semiconductor block having a predetermined conductivity type, a block principal surface, a back surface opposite to said principal surface, and a meandering internal side surface contiguous to said principal and said back surfaces, said internal side surface defining a groove extending in said semiconductor block and comprising first and second predetermined areas on said internal side surface and an intermediate area between and contiguous to said first and said second areas;
   a single crystal of an insulating material having a crystal principal surface in contact with said back surface, a portion of the crystal principal surface being exposed through said groove to define a bottom of said groove;
   a semiconductor layer of the conductivity type opposite to said predetermined conductivity type, said semiconductor layer covering said first, said second, and said intermediate areas, said semiconductor layer being electrically insulated from said crystal principal surface; and
   a first and a second contact layer of the opposite conductivity type along those predetermined areas of said block principal surface which are contiguous to said first and said second areas, respectively, said first and said second contact layers being electrically connected to those portions of said semiconductor layer which cover said first and said second areas, respectively.

6. A semiconductor resistor as claimed in claim 5, further comprising an insulator layer on said semiconductor layer and the bottom of said groove with said first and said second contact layers uncovered with said insulator layer.

7. A semiconductor resistor as claimed in claims 5 or 6, wherein said side surface is substantially perpendicular to the semiconductor block principal surface.

8. A semiconductor resistor as claimed in claims 5 or 6, wherein said side surface forms an angle other than a right angle with the semiconductor block principal surface.

9. A semiconductor resistor as claimed in any one of claims 1, 2, 5, and 6, wherein said meandering internal side surface defines a groove of substantially $\pi$-shaped configuration, said first and said second areas being located on those substantially inwardly directed portions of said side surface which are along the respective legs of the $\pi$-shaped figure adjacent to that line of said $\pi$-shaped figure which is extended on said legs, said intermediate area being continuously extended along said legs and that portion of said line which is interposed between said legs and is directed substantially against said legs.

10. A semiconductor resistor as claimed in claim 9, said internal side surface further comprising an additional intermediate area between said first and said second areas and along said line of said $\pi$-shaped figure except for that portion of said side surface which is directed substantially against said legs, said semiconductor resistor further comprising;
  an additional semiconductor layer of said opposite conductivity type on said additional intermediate area; and
  a third contact layer along the semiconductor block principal surface at a portion predetermined to be contiguous to that portion of said additional intermediate area which is directed substantially towards said legs, said third contact layer being electrically connected to said additional semiconductor layer.

* * * * *